(12) United States Patent
Zhu (10) Patent No.: US 10,727,307 B2
(45) Date of Patent: Jul. 28, 2020

(54) DISPLAY SUBSTRATE AND FABRICATION METHOD THEREOF, AND DISPLAY DEVICE

(71) Applicant: BOE TECHNOLOGY GROUP CO., LTD., Beijing (CN)

(72) Inventor: Xiaming Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 371 days.

(21) Appl. No.: 15/351,878

(22) Filed: Nov. 15, 2016

(65) Prior Publication Data

US 2017/0194362 A1 Jul. 6, 2017

(30) Foreign Application Priority Data

Jan. 5, 2016 (CN) .......................... 2016 1 0006929

(51) Int. Cl.
*H01L 29/786* (2006.01)
*H01L 29/417* (2006.01)
(Continued)

(52) U.S. Cl.
CPC .... *H01L 29/41733* (2013.01); *H01L 27/1225* (2013.01); *H01L 29/66969* (2013.01);
(Continued)

(58) Field of Classification Search
CPC ......... H01L 29/78687; H01L 29/7869–78693; H01L 29/78669; H01L 29/78678; H01L 29/66765; H01L 29/78648; H01L 29/78666; H01L 29/78675; H01L 29/66757; H01L 29/78693
See application file for complete search history.

(56) References Cited

U.S. PATENT DOCUMENTS 6,924,528 B2 * 8/2005 Yamazaki ............. H01L 27/127
257/327
8,030,655 B2 * 10/2011 Yamazaki ......... H01L 21/67017
257/67
(Continued)

FOREIGN PATENT DOCUMENTS

| CN | 1677626 A | 10/2005 |
|---|---|---|
| CN | 102738007 A | 10/2012 |
| JP | 6146067 A | 3/1986 |

OTHER PUBLICATIONS

The First Chinese Office Action dated Feb. 9, 2018; Appln. No. 201610006929.4.
(Continued)

*Primary Examiner* — Jarrett J Stark (57) ABSTRACT

A display substrate and a fabrication method thereof, and a display device are disclosed. The fabrication method of a display substrate, includes forming a first gate electrode on a transparent base substrate; forming a transparent gate insulating layer on the first gate electrode; forming a transparent active layer on the transparent gate insulating layer; forming a transparent source electrode and a transparent drain electrode on the transparent active layer, wherein, the transparent source electrode and the transparent drain electrode do not overlap with the first gate electrode in a thickness direction of the transparent base substrate.

4 Claims, 9 Drawing Sheets

(51) Int. Cl.
*H01L 29/66* (2006.01)
*H01L 27/12* (2006.01)

(52) U.S. Cl.
CPC .... *H01L 29/7869* (2013.01); *H01L 29/78648* (2013.01); *H01L 29/78696* (2013.01)

(56) References Cited

U.S. PATENT DOCUMENTS

| | | | | |
|---|---|---|---|---|
| 2005/0087769 | A1* | 4/2005 | Yamazaki | H01L 27/1214 257/202 |
| 2007/0069209 | A1* | 3/2007 | Jeong | H01L 29/78621 257/57 |
| 2008/0017854 | A1* | 1/2008 | Marks | B82Y 10/00 257/43 |
| 2010/0012940 | A1* | 1/2010 | Sato | H01L 27/1214 257/59 |
| 2011/0215328 | A1* | 9/2011 | Morosawa | H01L 29/786 257/59 |
| 2012/0223308 | A1* | 9/2012 | Okabe | G02F 1/1368 257/43 |
| 2012/0300147 | A1 | 11/2012 | Shieh et al. | |
| 2012/0305910 | A1* | 12/2012 | Hsieh | H01L 27/1222 257/43 |
| 2013/0119391 | A1* | 5/2013 | Kanegae | H01L 29/786 257/66 |
| 2013/0126869 | A1* | 5/2013 | Kanegae | H01L 29/786 257/57 |
| 2014/0138675 | A1* | 5/2014 | Yamazaki | H01L 29/66757 257/43 |
| 2014/0273362 | A1 | 9/2014 | Gao et al. | |
| 2015/0069382 | A1* | 3/2015 | Ahn | H01L 29/7869 257/43 |
| 2015/0303308 | A1* | 10/2015 | Wei | H01L 29/7869 257/43 |
| 2016/0322395 | A1* | 11/2016 | Koezuka | H01L 29/4908 |
| 2017/0213916 | A1* | 7/2017 | Niu | H01L 27/124 |
| 2018/0301472 | A1* | 10/2018 | Matsukizono | G02F 1/1368 |
| 2019/0123080 | A1* | 4/2019 | Kanicki | H01L 27/14616 |

OTHER PUBLICATIONS

Niko Munzenrieder, et al; "Flexibie Self-Aligned Double-Gate IGZO TFT", IEEE Electron Device Letters, vol. 35, No. 1, Jan. 2014; pp. 69-71.

The Second Chinese Office Action dated Jun. 25, 2018; Appln. No. 201610006929.4.

* cited by examiner

DISPLAY SUBSTRATE AND FABRICATION METHOD THEREOF, AND DISPLAY DEVICE

TECHNICAL FIELD

Embodiments of the present disclosure relate to a display substrate and a fabrication method thereof, and a display device.

BACKGROUND

In a related art, in order to improve electrical properties of a thin film transistor device on a display substrate, a thin film transistor of dual-gate structure (i.e., an upper gate and a bottom gate) may be fabricated. However, two gate electrodes and a source electrode and a drain electrode of the thin film transistor of dual-gate structure are usually formed by using different masks, the thin film transistor of dual-gate structure fabricated in this way has a large parasitic capacitance. With constant improvement in display size and resolution, a sum of all parasitic capacitances of the thin film transistors on an array substrate will become relatively large, which may directly degrade performance of a display device.

SUMMARY

An embodiment of the present disclosure provides a fabrication method of a display substrate, including: forming a first gate electrode on a transparent base substrate; forming a transparent gate insulating layer on the first gate electrode; forming a transparent active layer on the transparent gate insulating layer; forming a transparent source electrode and a transparent drain electrode on the transparent active layer, wherein, the transparent source electrode and the transparent drain electrode do not overlap with the first gate electrode in a thickness direction of the transparent base substrate.

Another embodiment of the present disclosure provides a display substrate, including: a transparent base substrate; a first gate electrode, arranged on the transparent base substrate; a transparent gate insulating layer, arranged on the first gate electrode; a transparent active layer, arranged on the transparent gate insulating layer: a transparent source electrode and a transparent drain electrode, arranged on the active layer, wherein, the transparent source electrode and the transparent drain electrode do not overlap with the first gate electrode in a thickness direction of the transparent base substrate.

Yet another embodiment of the present disclosure provides a display device including the above described display substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

The technical solutions of the embodiments of the present disclosure will be described in a clearly and fully understandable way in connection with the drawings. It is obvious that the described embodiments are just a part but not all of the embodiments of the present disclosure. Based on the described embodiments herein, those skilled in the art can obtain other embodiment(s), without any inventive work, which should be within the scope of the present disclosure.

Embodiments of the present disclosure provide a fabrication method of a display substrate, a display substrate and a display device, capable of reducing a parasitic capacitance of a thin film transistor of dual-gate structure.

Figure 1:
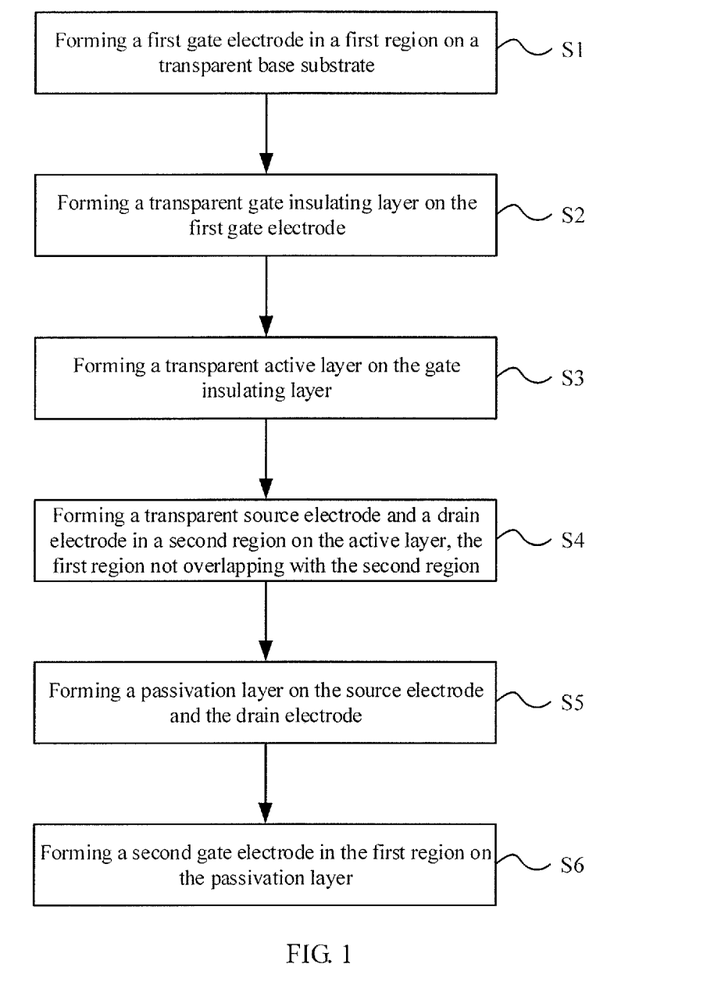
FIG. 1 shows a schematic flow diagram of a fabrication method of a display substrate according to an embodiment of the present disclosure.
Figure 9:
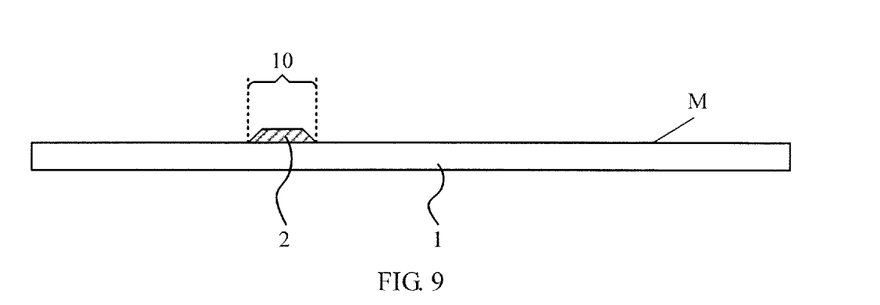
FIG. 9 to FIG. 15 show cross-sectional structural schematic diagrams of a display substrate in respective steps of the fabrication method of the display substrate according to an embodiment of the present disclosure.
Figure 10:
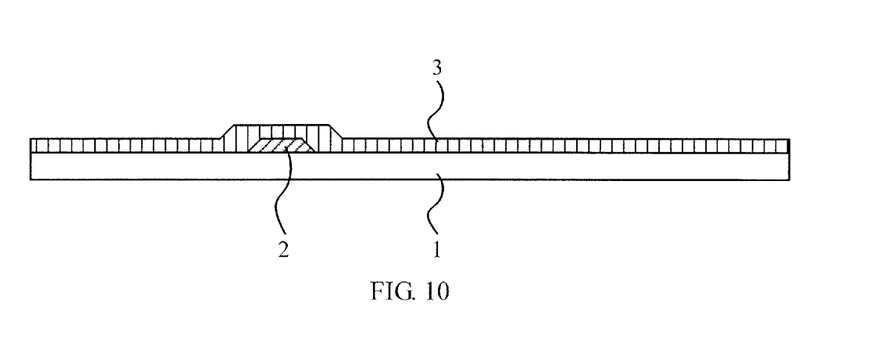
Figure 11:
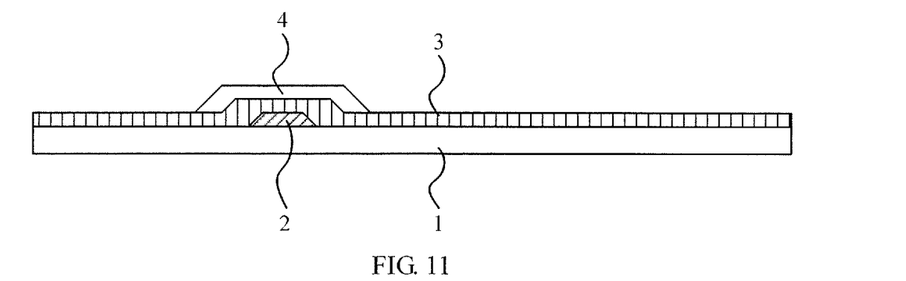
Figure 12:
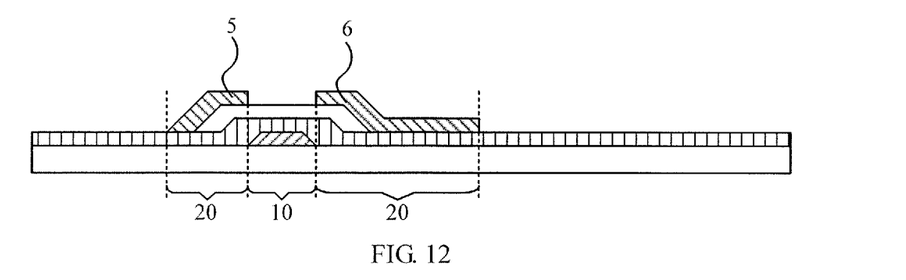

As shown in FIG. 1, a fabrication method of a display substrate according to an embodiment of the present disclosure, includes:

S1: forming a first gate electrode 2 in a first region 10 on a transparent base substrate 1, as shown in FIG. 9;

S2: forming a transparent gate insulating layer 3 on the first gate electrode 2, as shown in FIG. 10;

S3: forming a transparent active layer 4 on the gate insulating layer 3, as shown in FIG. 11;

S4: forming a transparent source electrode 5 and a drain electrode 6 in a second region 20 on the active layer 4 (which can adopt any of the materials such as indium tin oxide, indium zinc oxide, indium gallium zinc oxide, silver nanowires and the like); the first region 10 does not overlap with the second region 20, as shown in FIG. 12; for example, the first region 10 is adjacent to the second region 20.

Figure 13:
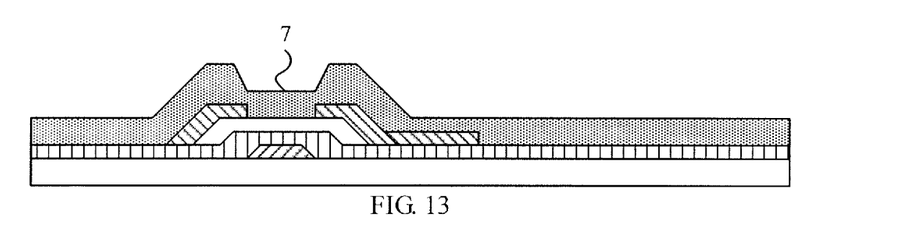
Figure 14:
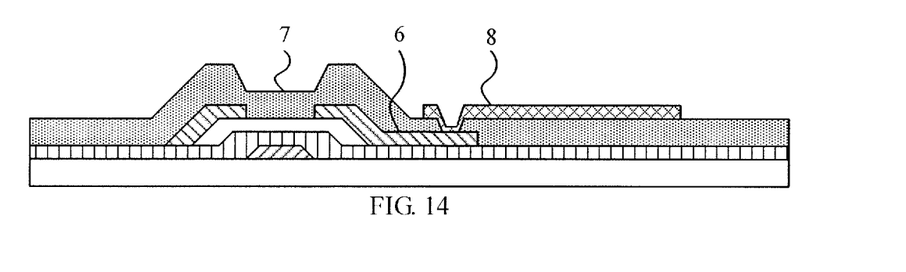
Figure 15:
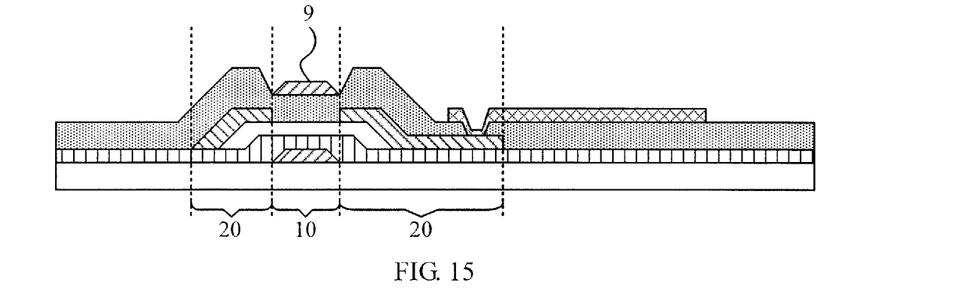

S5: forming a passivation layer 7 on the source electrode 5 and the drain electrode 6, as shown in FIG. 13; further forming a pixel electrode 8 on the passivation layer 7 after forming the passivation layer 7, which is electrically connected with the drain electrode 6 through a via hole in the passivation layer 7, as shown in FIG. 14;

S6: forming a second gate electrode 9 in the first region 10 on the passivation layer 7, as shown in FIG. 15;

Because layer structures (i.e., the gate insulating layer and the active layer) between the first gate electrode and the transparent source and drain electrodes are transparent, the transparent source and drain electrodes can be formed by directly taking the first gate electrode as a mask for forming the transparent source and drain electrodes. According to a self-aligning process of the embodiment, the second region where the transparent source and drain electrodes are located may not be overlapped with the first region where the first gate electrode is located, and thus a parasitic capacitance caused by overlapping of the source and drain electrodes with the first gate electrode can be reduced.

And, because the layer structures (i.e., the gate insulating layer, the active layer, the source electrode, the drain electrode and the passivation layer) between the first gate electrode and the second gate electrode are transparent, the second gate electrode can be formed by directly taking the first gate electrode as a mask for forming the second gate electrode; the second gate electrode is also formed in the first region by using the self-aligning process, and does not overlap with the source and drain electrodes located in the second region, and thus a parasitic capacitance caused by overlapping of the second gate electrode with the source and drain electrodes can be reduced. A thin film transistor of dual-gate structure fabricated by using the technical solution described above, has larger transconductance, smaller sub-threshold swing and parasitic capacitance, and is capable of improving electrical properties of a display substrate when it applies thereto.

Figure 2:
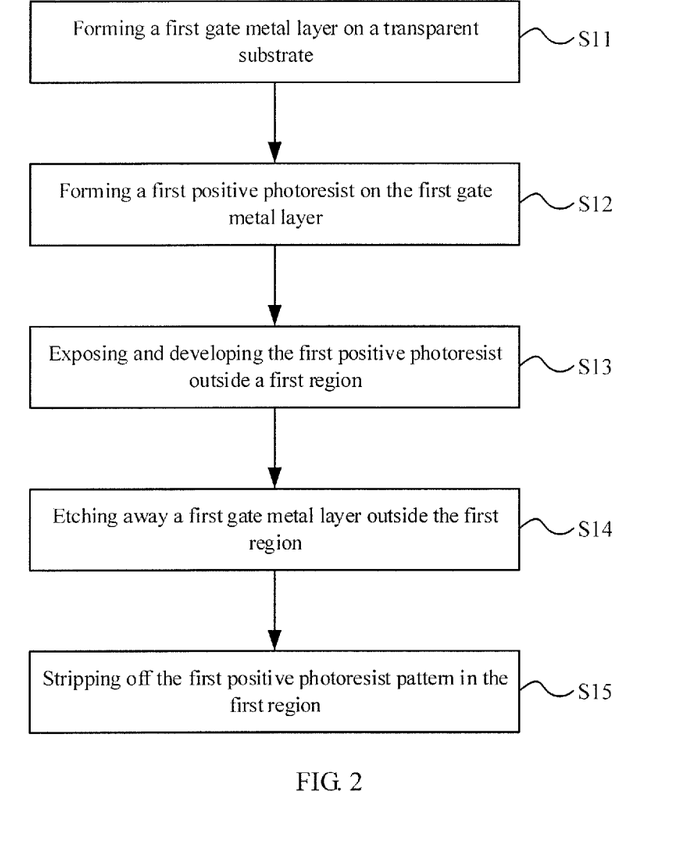
FIG. 2 shows a schematic flow diagram of forming a first gate electrode according to an embodiment of the present disclosure.

As shown in FIG. 2, for example, forming the first gate electrode includes:

S11: forming a first gate metal layer on a transparent substrate;

S12: forming a first positive photoresist on the first gate metal layer;

S13: exposing the first positive photoresist outside the first region (i.e., irradiating a portion of first positive photoresist outside the first region, for example, a portion of first positive photoresist in the second region) and developing the first positive photoresist exposed, to form a first positive photoresist pattern located in the first region;

S14: etching away a first gate metal layer outside the first region (i.e., etching away a portion of the first gate metal layer which is not covered by the first positive photoresist pattern);

S15: stripping off the first positive photoresist pattern in the first region, so that a remaining portion of the first gate metal layer is formed as the first gate electrode.

Figure 3:
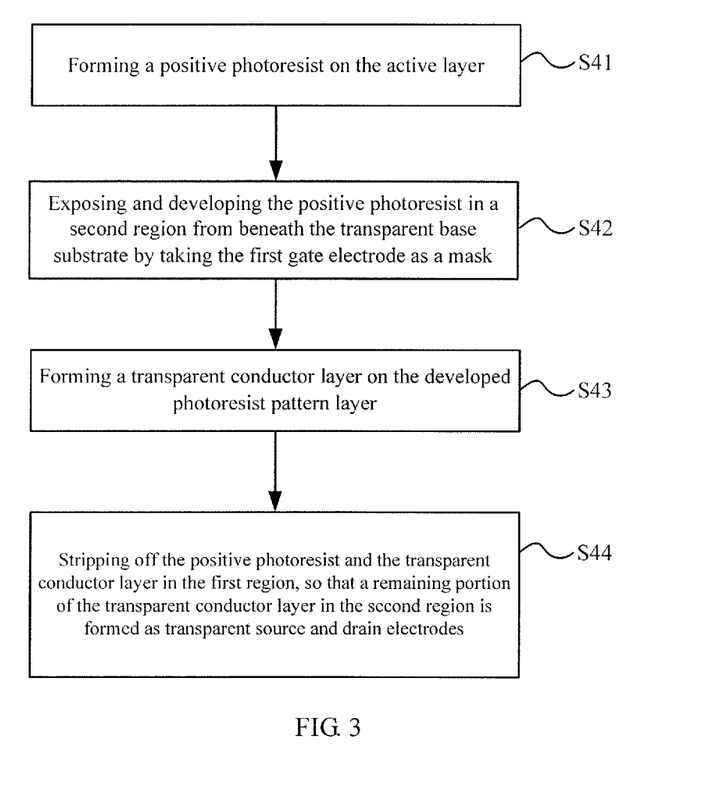
FIG. 3 shows a schematic flow diagram of forming a source gate electrode and a drain electrode according to an embodiment of the present disclosure.

As shown in FIG. 3, for example, forming the source electrode and the drain electrode includes:

S41: forming a second positive photoresist on the active layer;

S42: taking the first gate electrode as a mask, exposing the second positive photoresist in the second region from beneath the transparent base substrate (irradiating a portion of the second positive photoresist located in the second region with light from below the transparent substrate), and developing the second positive photoresist exposed, to form a second positive photoresist pattern in the first region;

S43: forming a transparent conductor layer on the second positive photoresist pattern;

S44: stripping off a portion of the second positive photoresist and a portion of the transparent conductor layer in the first region (i.e., stripping off the second positive photoresist pattern and a portion of the transparent conductor layer located thereon), so that a remaining portion of the transparent conductor layer in the second region is formed as the transparent source and drain electrodes.

Because the layer structures between the first gate electrode and the transparent source and drain electrodes are transparent, the transparent source and drain electrodes can be formed by directly taking the first gate electrode as a mask, the second region where the source and drain electrodes formed by using the self-aligning process are located does not overlap with the first region where the first electrode is located, and thus a parasitic capacitance caused by overlapping of the source and drain electrodes with the first gate electrode can be reduced effectively.

Herein, the portion of the second positive photoresist in the second region can be removed by exposing and developing, a transparent conductor layer is formed on the developed photoresist pattern layer, and the transparent conductor layer in the first region is located on unremoved (left) photoresist, and can be stripped off with the positive photoresist, so that a remaining portion of the transparent conductor layer in the second region after stripping is served as the transparent source and drain electrodes.

Figure 4:
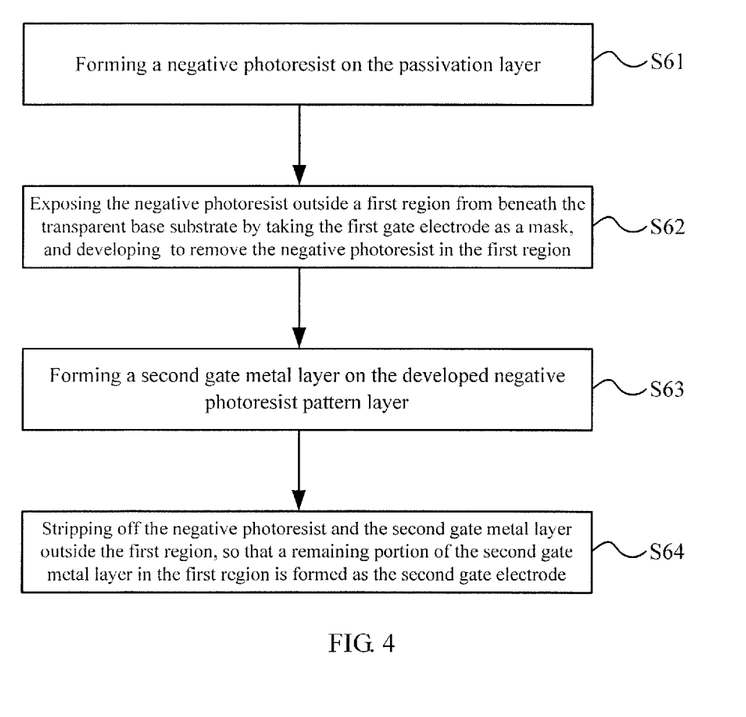
FIG. 4 shows a schematic flow diagram of forming a second gate electrode according to an embodiment of the present disclosure.

As shown in FIG. 4, for example, forming the second gate electrode includes:

S61: forming a negative photoresist on the passivation layer;

S62: exposing and developing the negative photoresist outside a first region from beneath the transparent base substrate by taking the first gate electrode as a mask, to remove the negative photoresist in the first region to form a negative photoresist pattern;

S63: forming a second gate metal layer on the developed negative photoresist pattern layer (i.e., the negative photoresist pattern);

S64: stripping off a portion of the negative photoresist and a portion of the second gate metal layer outside the first region (i.e., stripping off the negative photoresist pattern and a portion of the second gate metal layer located thereon), so as to take a remaining portion of the second gate metal layer in the first region as a second gate electrode.

Because the layer structures between the first gate electrode and the second gate electrode are transparent, the second gate electrode may be formed by directly taking the first gate electrode as a mask, the second gate electrode formed by using the self-aligning process is also located in the first region, and thus a parasitic capacitance caused by overlapping of the second gate electrode with the source and drain electrodes may be reduced effectively.

The negative photoresist outside the first region is cured after exposing, and the negative photoresist in the first region is not exposed due to shielding of the first gate electrode, which may be directly removed by developing; next, a second gate metal layer is formed on a remaining portion of the negative photoresist pattern layer, the second gate metal layer in the second region is located on the cured negative photoresist, which may be stripped off with the negative photoresist, so that a remaining portion of the second gate metal layer in the first region after stripping serves as the second gate electrode.

Figure 5:
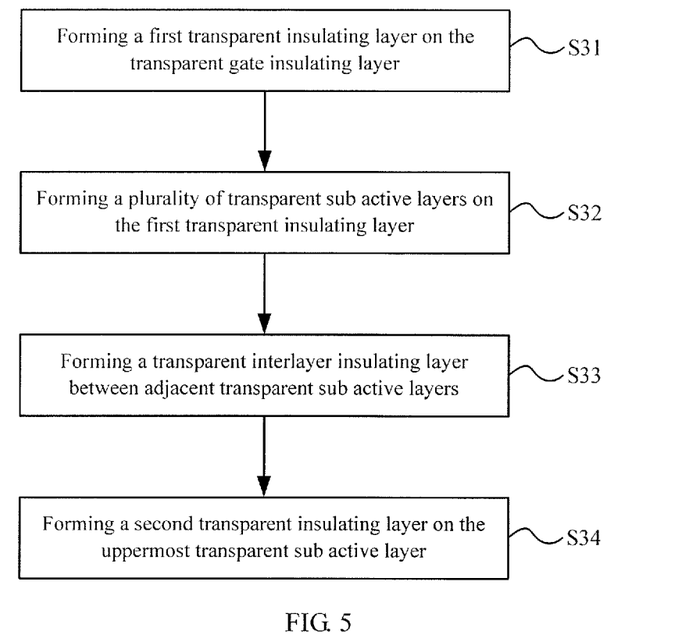
FIG. 5 shows a schematic flow diagram of forming an active layer according to an embodiment of the present disclosure.

As shown in FIG. 5, for example, forming the active layer includes:

S31: forming a first transparent insulating layer on the transparent gate insulating layer;

S32: forming a plurality of transparent sub active layers on the first transparent insulating layer;

S33: forming a transparent interlayer insulating layer between adjacent transparent sub active layers;

S34: forming a second transparent insulating layer on an uppermost transparent sub active layer.

In the embodiment, the active layer is a superlattice structure formed by growing insulating layers (interlayer insulating layers) and the sub active layers (semiconductor layers) alternately and periodically; a thickness of the semiconductor layer is of a magnitude of 10 nm, and a thickness of the insulating layer is less than 3 nm.

In a related technology of a metal oxide thin film transistor, an active layer is of a single-layer structure, a gate insulating layer thereof is formed by a chemical vapor deposition method, and the active layer is formed by a physical vapor deposition method. That is, the two key layers for determining electrical properties of a thin film transistor device are formed by two processes respectively, resulting in lots of defect states on an interface between the gate insulating layer and the active layer. These defect states will limit carriers migrating in the active layer, resulting in deterioration of device performance, such as low mobility, large threshold voltage shift under gate bias effect.

In the embodiment, the active layer having a superlattice structure is formed in a manner of alternately and periodically growing ultrathin insulating layers and ultrathin semiconductor layers (by a sputtering method, for example) in a same vacuum environment. That is, each of the ultrathin insulating layers and the ultrathin semiconductor layers is formed at a same vacuum degree, wherein, the insulating layers for passivation (a first transparent insulating layer and a second transparent insulating layer) are arranged on upper and lower outer sides of the active layer having the superlattice structure, so that properties of an oxide semiconductor material in the active layer remain stable. In addition, the semiconductor layer in the superlattice structure is very thin, and can be set on the order of 10 nanometers; carriers in the semiconductor layer can be limited to moving in a two-dimensional plane due to a quantum effect, so that the carriers have high mobility. The insulating layer for passivation can be also very thin, for example, in the order of 3 nanometers; and the carriers moving in the semiconductor layer can pass the insulating layer to arrive in another one of the semiconductor layers at a certain probability due to a quantum tunneling effect, so that a stable current is formed between the source electrode and the drain electrode. In a thin film transistor employing the active layer having the superlattice structure described above, defect states in an active layer, on an interface between the active layer and a gate insulating layer may be greatly reduced, and thus the thin film transistor has more excellent electrical properties, such as higher carrier mobility, better threshold voltage stability and so on.

Figure 6:
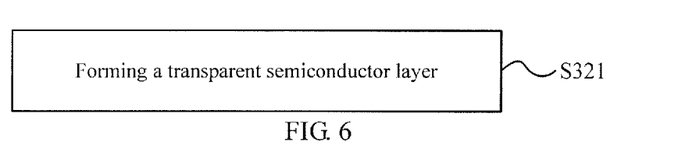
FIG. 6 shows a schematic flow diagram of forming a sub active layer according to an embodiment of the present disclosure.

As shown in FIG. 6, for example, forming each of the sub active layers includes:

S321: forming a transparent semiconductor layer.

In the embodiment, for example, each of the sub active layers is formed by only one transparent semiconductor layer.

Figure 7:
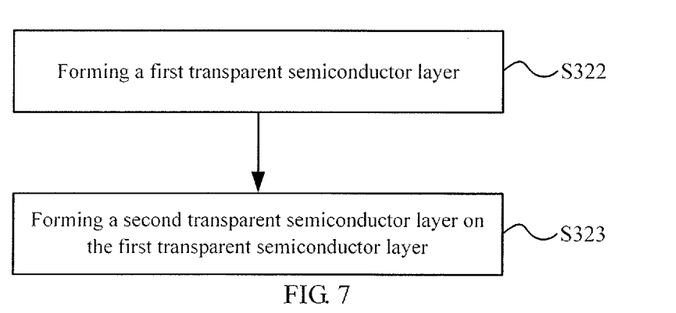
FIG. 7 shows a schematic flow chart of forming a sub active layer according to another embodiment of the present disclosure.

As shown in FIG. 7, for example, forming each of the sub active layers of the active layer includes:

S322: forming a first transparent semiconductor layer;

S323: forming a second transparent semiconductor layer on the first transparent semiconductor layer.

Wherein, a thickness of the semiconductor layer is on a magnitude of 10 nm, and a thickness of the insulating layer is less than 3 nm.

In the embodiment, the sub active layer can include two semiconductor layers, wherein, the first transparent semiconductor layer can be a metal oxide semiconductor, and the second transparent semiconductor layer can be a metal nitrogen oxide semiconductor. Because the metal nitrogen oxide semiconductor has higher carrier mobility, and the metal oxide semiconductor has better stability, these two semiconductor materials are combined in the superlattice structure, to obtain a material having higher mobility and better stability.

Figure 8:
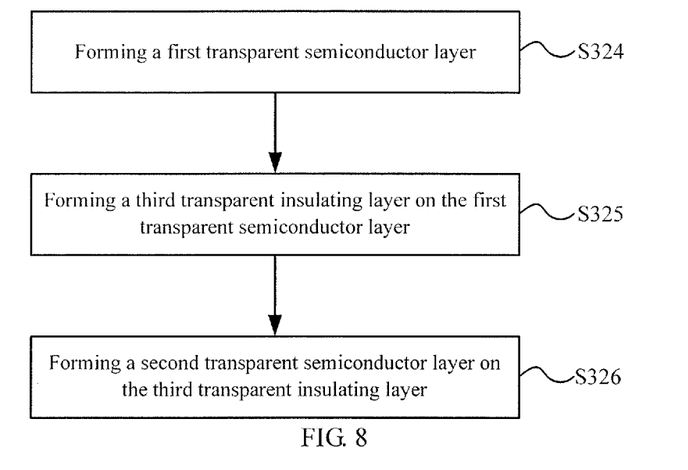
FIG. 8 shows a schematic flow chart of forming a sub active layer according to still another embodiment of the present disclosure.

As shown in FIG. 8, for example, forming each of the active layers includes:

S324: forming a first transparent semiconductor layer;

S325: forming a third transparent insulating layer on the first transparent semiconductor layer;

S326: forming a second transparent semiconductor layer on the third transparent insulating layer.

Wherein, a thickness of the semiconductor layer is on the order of 10 nm, and a thickness of the insulating layer is less than 3 nm. The sub active layers and the interlayer insulating layer are alternately formed as an active layer between the first transparent insulating layer and the second transparent insulating layer.

In the active layer having the superlattice structure in the embodiment, except that the transparent insulating layers are arranged on upper and lower outer sides, an insulating layer is further arranged between two semiconductor layers in each of the sub active layers; in this way, defect states on an interface between the two semiconductor layers can be reduced, and mobility and stability of carriers in the active layer are further improved.

Figure 16:
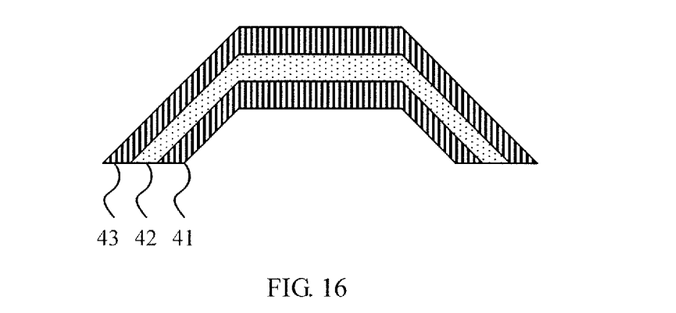
FIG. 16 shows a sectional structure diagram of an active layer according to an embodiment of the present disclosure.

It should be noted that, FIG. 16 only shows a structure of arranging one sub active layer between the first transparent insulating layer and the second transparent insulating layer, and actually a plurality of sub active layers and the interlayer insulating layers can be arranged between the first transparent insulating layer and the second transparent insulating layer, to alternatively and periodically grow to form the active layer. The structure of the active layer in the embodiment of the present disclosure, besides application to the thin film transistor of dual-gate structure shown in the embodiment, can be further applied to other thin film transistors having an active layer, for example, a bottom-gate or top-gate thin film transistor of etch stop type, a bottom-gate or top-gate thin film transistor of back channel etch type, and the like.

For example, forming the transparent active layer includes:

Forming the first transparent insulating layer, the second transparent insulating layer, the transparent sub active layer (s) and the transparent interlayer insulating layer(s) in a same vacuum environment.

Wherein forming processes adopted by the above-mentioned flows may include: a film forming process, patterning processes such as exposing and etching and so on.

An embodiment of the present disclosure further provides a display substrate, including: a transparent base substrate 1; a first gate electrode 2, arranged in a first region 10 on the transparent base substrate 1; a transparent gate insulating layer 3, arranged on the first gate electrode 2; a transparent active layer 4, arranged on the gate insulating layer 3; a transparent source electrode 5 and a transparent drain electrode 6, arranged in a second region 20 on the active layer 4, the first region 10 not overlapping with the second region 20; the transparent source electrode 5 and the transparent drain electrode 6 not overlapping with the first gate electrode 2 in a thickness direction of the transparent base substrate 1. Herein, the thickness direction of the transparent base substrate 1, for example, can be a direction perpendicular to a main surface (e.g., an upper surface M) of the transparent base substrate 1.

A passivation layer 7 is arranged on the source electrode 5 and the drain electrode 6; a second gate electrode 9 is arranged in the first region 10 on the passivation layer 7, the second gate electrode 9 not overlapping with the transparent source electrode 5 and the transparent drain electrode 6 in a thickness direction of the transparent base substrate 1.

Figure 19:
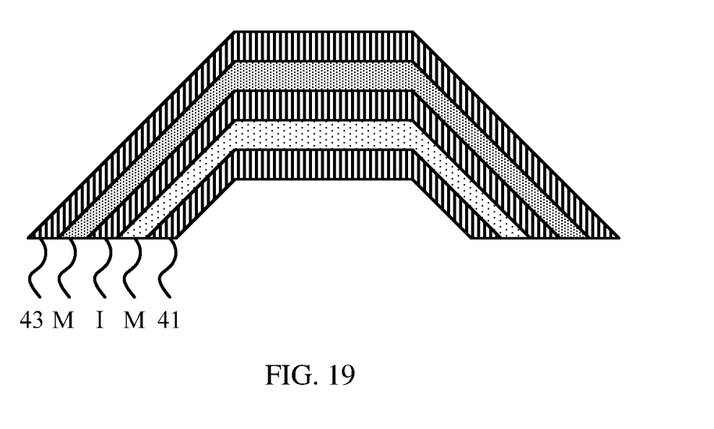
FIG. 19 shows a sectional structure diagram of an active layer according to still another embodiment of the present disclosure.

For example, referring to FIG. 19, the active layer 4 includes: a first transparent insulating layer 41 arranged on the transparent gate insulating layer 3; two transparent sub active layers M, and a second transparent insulating layer 43 provided on the uppermost transparent sub active layer M.

Figure 18:
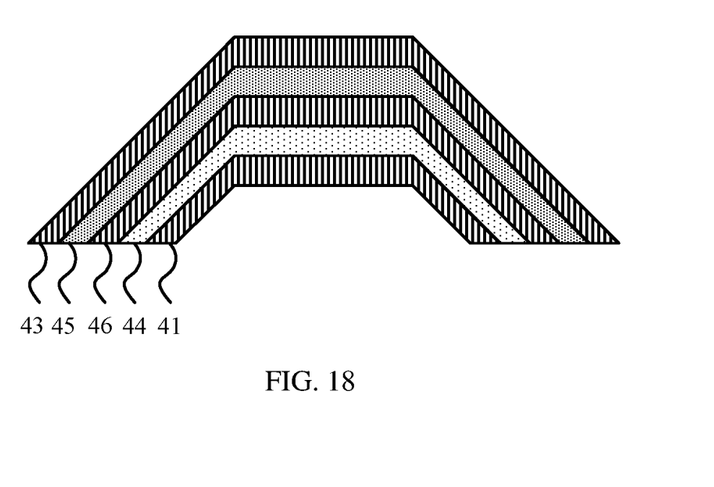
FIG. 18 shows a sectional structure diagram of an active layer according to still another embodiment of the present disclosure.

For example, referring to FIG. 18, the active layer 4 includes: a first transparent insulating layer 41, arranged on the transparent gate insulating layer 3; a transparent sub active layer M, including two transparent semiconductor layers 44 and 45, arranged on the first transparent insulating layer 41; a third transparent insulating layer 46, arranged between the two transparent semiconductor layers 44 and 45; a second transparent insulating layer 43, arranged on the uppermost transparent sub active layer 45.

For example, thicknesses of the first transparent semiconductor layer 44, the second transparent semiconductor layer 45 are less than 10 nm, respectively; and thicknesses of the first transparent insulating layer 41, the second transparent insulating layer 43 and the third transparent insulating layer 46 are less than 3 nm, respectively.

For example, in another example, as shown in FIG. 16, the active layer 4 includes: a first transparent insulating layer 41, a second transparent insulating layer 43 and a transparent semiconductor layer 42 sandwiched therebetween. Herein, the transparent semiconductor layer 42 is formed as one transparent sub active layer M.

For example, a thickness of the transparent semiconductor layer 42 is less than 10 nm, and thickness of the first transparent insulating layer 41 and the second transparent insulating layer 43 are less than 3 nm.

Figure 17:
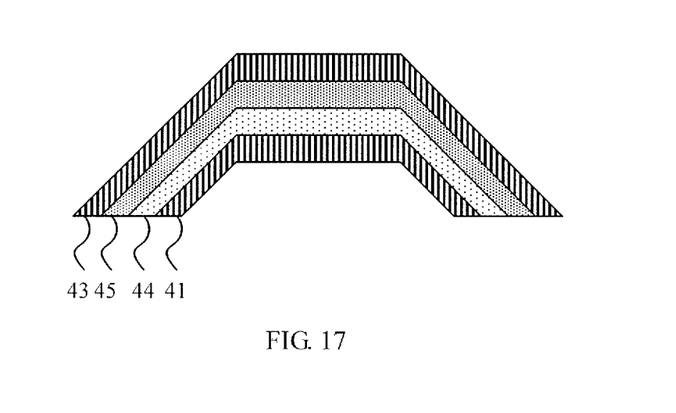
FIG. 17 shows a sectional structure diagram of an active layer according to another embodiment of the present disclosure.

For example, in still another example, as shown in FIG. 17, the active layer 4 includes: a first transparent insulating layer 41, a second transparent insulating layer 43 and a first transparent semiconductor layer 44 and a second transparent semiconductor layer 45 located between the first transparent insulating layer 41 and the second transparent insulating layer 43. The second transparent semiconductor layer 45 is arranged on the first transparent semiconductor layer 44. Herein, the first and second transparent semiconductor layer 44 and 45 are formed as one transparent sub active layer M.

For example, respective thicknesses of the first transparent semiconductor layer 44 and the second transparent semiconductor layer 45 are less than 10 nm, and respective thicknesses of the first transparent insulating layer 41 and the second transparent insulating layer 43 are less than 3 nm.

In the embodiments of the present disclosure, the transparent structure means that the structure at least allows the light used in the relevant exposing step to pass therethrough.

An embodiment of the present disclosure further provides a display device, including the display substrate described above.

It should be noted that the display device in the embodiment can be any product or part having a display function, e.g., electronic paper, a mobile phone, a tablet computer, a television, a notebook computer, a digital photo frame, a navigator, etc.

The technical solutions of the present disclosure are described in detail in conjunction with the accompanying drawings in the above. Considering that there is a problem of a parasitic capacitance caused by overlapping the gate electrode with the source electrode and the drain electrode during forming a thin film transistor of dual-gate structure in the related art, the technical solutions of the present disclosure are used. Because the layer structures between the first gate electrode and the transparent source and drain electrodes are transparent, the transparent source and drain electrodes can be formed by taking the first gate electrode as a mask, so that the second region where the transparent source and drain electrodes are located does not overlap with the first region where the first gate electrode is located, and thus a parasitic capacitance caused by overlapping the source and drain electrodes with the first gate electrode may be reduced. And, because the layer structures between the first gate electrode and the second gate electrode are transparent, the second gate electrode may be formed by taking the first gate electrode as a mask, so that the second gate electrode is also formed in the first region, which does not overlap with the source and drain electrodes located in the second region, and thus a parasitic capacitance caused by overlapping the second gate electrode with the source and drain electrodes can be reduced.

It should be noted that in the drawings, in order to make diagrams clear, sizes of layers and regions are possibly exaggerated. Moreover, it can be understood that when a component or a layer is known to be "on" another component or layer, the component or the layer can be directly on other components, or middle layers can present. In addition, it can be understood that when the component or the layer is known to be "below" or "beneath" another component or layer, the component or the layer can be directly under other components, or more than one middle layers or components can present. In addition, it also can be understood that when the layer or the component is known to be "between" two layers or two components, the layer or the component can be the only layer between two layers or two components, or more than one middle layers or components also can present. Throughout the description, similar reference signs indicate similar components.

In the present disclosure, terms such as "first", "second", "third" and so on are only used for descriptive purposes, and cannot be construed as indicating or implying relative importance. Terms such as "a plurality of" indicate there are at least two, unless specifically defined otherwise.

Although the present disclosure is described in detail hereinbefore with general illustration and embodiments, based on the present disclosure, certain amendments or improvements can be made thereto, which is obvious for those skilled in the art. Therefore, the amendments or improvements made to the present disclosure without departing from the spirit of the present disclosure should be within the scope of the present disclosure.

The present application claims priority of Chinese Patent Application No. 201610006929.4 filed on Jan. 5, 2016, the present disclosure of which is incorporated herein by reference in its entirety as part of the present application.

What is claimed is:
1. A display substrate, comprising: a transparent base substrate;

a first gate electrode, arranged on the transparent base substrate; a transparent gate insulating layer, arranged on the first gate electrode;

a transparent active layer, arranged on the transparent gate insulating layer; a transparent source electrode and a transparent drain electrode, arranged on the active layer, wherein, the transparent source electrode and the transparent drain electrode do not overlap with the first gate electrode in a thickness direction of the transparent base substrate, and wherein an edge of a vertical projection of the transparent source electrode on an upper surface of the transparent base substrate is partially collinear with an edge of a vertical projection of the first gate electrode on the upper surface of the transparent base substrate, and an edge of a vertical projection of the transparent drain electrode on the upper surface of the transparent base substrate is partially collinear with the edge of the vertical projection of the first gate electrode on the upper surface of the transparent base substrate, a transparent passivation layer arranged on the source electrode and the drain electrode; and a second gate electrode arranged on the passivation layer, wherein an edge of a vertical protection of the second cate electrode on the upper surface of the transparent base substrate completely coincides with the edge of the vertical protection of the first cate electrode on the upper surface of the transparent base substrate, the edge of the vertical protection of the transparent source electrode on the upper surface of the transparent base substrate is partially collinear with the edge of the vertical protection of the second cate electrode on the upper surface of the transparent base substrate, and the edge of the vertical protection of the transparent drain electrode on the upper surface of the transparent base substrate is partially collinear with the edge of the vertical protection of the second pate electrode on the upper surface of the transparent base substrate, wherein the transparent active layer includes: a first transparent insulating layer on the transparent cate insulating layer; at least two transparent sub active layers on the first transparent insulating layer; and a second transparent insulating layer on an uppermost one of the at least two transparent sub active layers, and wherein each of the at least two transparent sub active layers is comprised of a first transparent semiconductor layer, a second transparent semiconductor layer, and a third transparent insulating layer formed therebetween.

2. The display substrate according to claim 1, wherein, a transparent interlayer insulating layer is formed between every adjacent two of the at least two transparent sub active layers.

3. The display substrate according to claim 1, wherein, respective thicknesses of the first transparent semiconductor layer and the second transparent semiconductor layer are less than 10 nm, and respective thicknesses of the first transparent insulating layer, the second transparent insulating layer and the transparent interlayer insulating layer(s) are less than 3 nm.

4. A display device, comprising the display substrate according to claim 1.

* * * * *